US012701773B2

(12) United States Patent
Tucker et al.

(10) Patent No.: US 12,701,773 B2
(45) Date of Patent: Aug. 4, 2026

(54) BONDING LAYER BETWEEN STACKED INTEGRATED CIRCUITS

(71) Applicant: Honeywell International Inc.,
Charlotte, NC (US)

(72) Inventors: James L. Tucker, Clearwater, FL (US);
Eric E. Vogt, Independence, MN (US);
James W Karcz, Jr., Plymouth, MN
(US)

(73) Assignee: Honeywell International Inc.,
Charlotte, NC (US)

( * ) Notice: Subject to any disclaimer, the term of this
patent is extended or adjusted under 35
U.S.C. 154(b) by 481 days.

(21) Appl. No.: 18/299,368

(22) Filed: Apr. 12, 2023

(65) Prior Publication Data

US 2024/0347386 A1     Oct. 17, 2024

(51) Int. Cl.
*H10W 72/00*        (2026.01)
*H10D 84/03*        (2025.01)
*H10D 88/00*        (2025.01)
*H10W 40/25*        (2026.01)
*H10W 72/20*        (2026.01)

(52) U.S. Cl.
CPC ........... *H10D 84/038* (2025.01); *H10D 88/01*
(2025.01); *H10W 40/257* (2026.01); *H10W
72/00* (2026.01); *H10W 72/072* (2026.01);
*H10W 72/07231* (2026.01); *H10W 72/247*
(2026.01)

(58) Field of Classification Search
CPC ..... H01L 23/3733; H01L 23/50; H01L 24/01;
H01L 2224/0212; H01L 2224/02122;
H01L 2224/0214; H01L 2224/02141;
H01L 2224/0215; H01L 2224/1012;
H01L 2224/10125; H01L 2224/10126;
H10W 72/00; H10W 72/241; H10W
72/244; H10W 72/247; H10W 72/248;
H10W 72/851; H10W 72/853
See application file for complete search history.

(56) References Cited

U.S. PATENT DOCUMENTS

| | | | |
|---|---|---|---|
| 6,458,609 B1 | 10/2002 | Hikita et al. | |
| 6,635,962 B2 | 10/2003 | Shibata et al. | |
| 8,058,143 B2 * | 11/2011 | Montez ................... | H01L 24/94 |
| | | | 438/117 |
| 8,279,615 B2 | 10/2012 | Schmid et al. | |
| 9,087,883 B2 | 7/2015 | Lee et al. | |
| 10,861,816 B2 | 12/2020 | Joshi et al. | |
| 2008/0169569 A1 | 7/2008 | Ishihara et al. | |

(Continued)

FOREIGN PATENT DOCUMENTS

JP            3063691 B2     7/2000

*Primary Examiner* — Reema Patel
(74) *Attorney, Agent, or Firm* — Shumaker & Sieffert,
P.A.

(57)            ABSTRACT

A semiconductor assembly including: a first semiconductor
having a plurality of electrical contacts extending from an
upper surface of the first semiconductor; a second semicon-
ductor adjacent to the first semiconductor; and a mesh
disposed between and affixed to the upper surface of the first
semiconductor and the lower surface of the second semi-
conductor. A lower surface of the second semiconductor is
electrically connected to the first semiconductor via the
plurality of electrical contacts. The mesh comprises a plu-
rality of interconnecting struts defining a plurality of open-
ings, wherein the plurality of openings is configured to
receive the plurality of electrical contacts.

20 Claims, 5 Drawing Sheets

(56)                        References Cited

U.S. PATENT DOCUMENTS

2020/0126943 A1*  4/2020  Joshi ........................ H01L 24/33
2022/0262715 A1*  8/2022  Bean ................. H01L 23/49838
2023/0058638 A1*  2/2023  Abraham ................ H01L 25/50

* cited by examiner

BONDING LAYER BETWEEN STACKED INTEGRATED CIRCUITS

TECHNICAL FIELD

The present disclosure relates to stacked integrated circuits.

BACKGROUND

Three-dimensional (3D) integrated circuits are employed in applications in which space is a critical design factor. 3D integrated circuits reduce space required for the integrated circuits and lengths of interconnects between circuit components of the integrated circuits. Integrated circuits may be vertically stacked to facilitate efficient user of space. In some examples, the stacked integrated circuit components may be packaged in a package, and electrically coupled to a printed board.

SUMMARY

In general, the disclosure is directed to integrated circuit systems that include multiple integrated circuit (IC) dies and bonding layers between vertically adjacent IC dies, and to techniques for forming such integrated circuit systems. A plurality of ICs may be vertically stacked to form a three-dimensional (3D) IC assembly. Vertically adjacent ICs may be electrically coupled to each other, e.g., via one or more electrical contacts). Adjacent ICs of the 3D IC assembly may be connected by a bonding layer. The 3D IC assembly may be disposed on a substrate and components of each IC may be connected to a substrate via bonding wires. Adjacent ICs may be connected via electrical contacts disposed on the surfaces of the ICs.

During operation, the 3D IC assembly may define a thermal profile along its height. The 3D IC assembly and/or the substrate may define a reference thermal plane defining a maximum operating temperature of the ICs. Each IC assembly may have a thermal operating budget based at least in part on the maximum operating temperature across the ICs of the assembly. The thermal operating budget is determined for an IC assembly to prevent overheating of any one IC in the assembly. A higher maximum operating temperature may reduce the overall thermal operating budget for the IC assembly. The thermal operating budget may be allocated to select which ICs to include and/or a number of ICs to include in an IC assembly.

The examples devices, systems, and methods described in this disclosure relates to example bonding layers between ICs. The bonding layers described herein may form interconnect struts that define a mesh between two adjacent ICs in a 3D IC assembly. The struts may form openings defining the mesh. Openings may form a seal (e.g., a hermetic seal) between the adjacent ICs. In some examples, the openings may be configured to retain electrical contacts of the adjacent ICs and form the seal around the electrical contacts.

The mesh may provide several benefits over other bonding layers. In some examples, the mesh may provide improved stress relief within a 3D IC assembly over other bonding layers. In some examples, the mesh may increase heat dissipation and/or heat distribution across a larger area of the bonding layer, thereby increase the thermal resistance of the 3D IC assembly. The increased thermal resistance may reduce a maximum operating temperature and increase the thermal budget for the assembly. The increased thermal resistance may allow for reductions in the thicknesses of the ICs of the assembly without negatively affecting the thermal budget of the stack. In some examples, the mesh forms hermetic seals around the electrical contact of the adjacent ICs, thereby isolating electrical contacts from external signals and improving the transmission of signals between ICs.

In some examples, the disclosure describes a stacked semiconductor assembly comprising: a first semiconductor having a plurality of electrical contacts extending from an upper surface of the first semiconductor; a second semiconductor adjacent to the first semiconductor, wherein a lower surface of the second semiconductor is electrically connected to the first semiconductor via the plurality of electrical contacts; and a mesh disposed between and affixed to the upper surface of the first semiconductor and the lower surface of the second semiconductor, wherein the mesh comprises a plurality of interconnecting struts defining a plurality of openings, and wherein the plurality of openings is configured to receive the plurality of electrical contacts.

In some examples, the disclosure describes a semiconductor mesh interface comprising: an adhesive material comprising a plurality of interconnecting struts defining a plurality of openings extending from a first surface of the adhesive material to a second surface of the adhesive material, wherein the first surface of the adhesive material is configured to be affixed to an upper surface of a first semiconductor, wherein the second surface of the adhesive material is configured to be affixed to a lower surface of a second semiconductor, wherein one or more of the plurality of openings is configured to receive electrical contacts extending between the first semiconductor and the second semiconductor.

In some examples, the disclosure describes a method comprising: disposing a mesh over a first surface of a first semiconductor, wherein the mesh comprises: an adhesive material comprising a plurality of interconnecting struts defining a plurality of openings, wherein when the mesh is disposed over the first surface of the first semiconductor, the plurality of openings is configured to receive a first plurality of electrical contacts extending from the first surface of the first semiconductor; aligning a second plurality of electrical contacts extending from a second surface of a second semiconductor with the first plurality of electrical contacts of the first semiconductor; electrically connecting the first semiconductor with the second semiconductor via the first plurality of electrical contacts and the second plurality of electrical contacts; and affixing a first surface of the mesh to the first surface of the first semiconductor and a second surface of the mesh to the second surface of the second semiconductor.

The details of one or more examples are set forth in the accompanying drawings and the description below. Other features, objects, and advantages will be apparent from the description and drawings, and from the claims.

BRIEF DESCRIPTION OF THE FIGURES

The details of one or more examples of this disclosure are set forth in the accompanying drawings and the description below. Other features, objects, and advantages of this disclosure will be apparent from the description and drawings, and from the claims.

DETAILED DESCRIPTION

Figure 1:
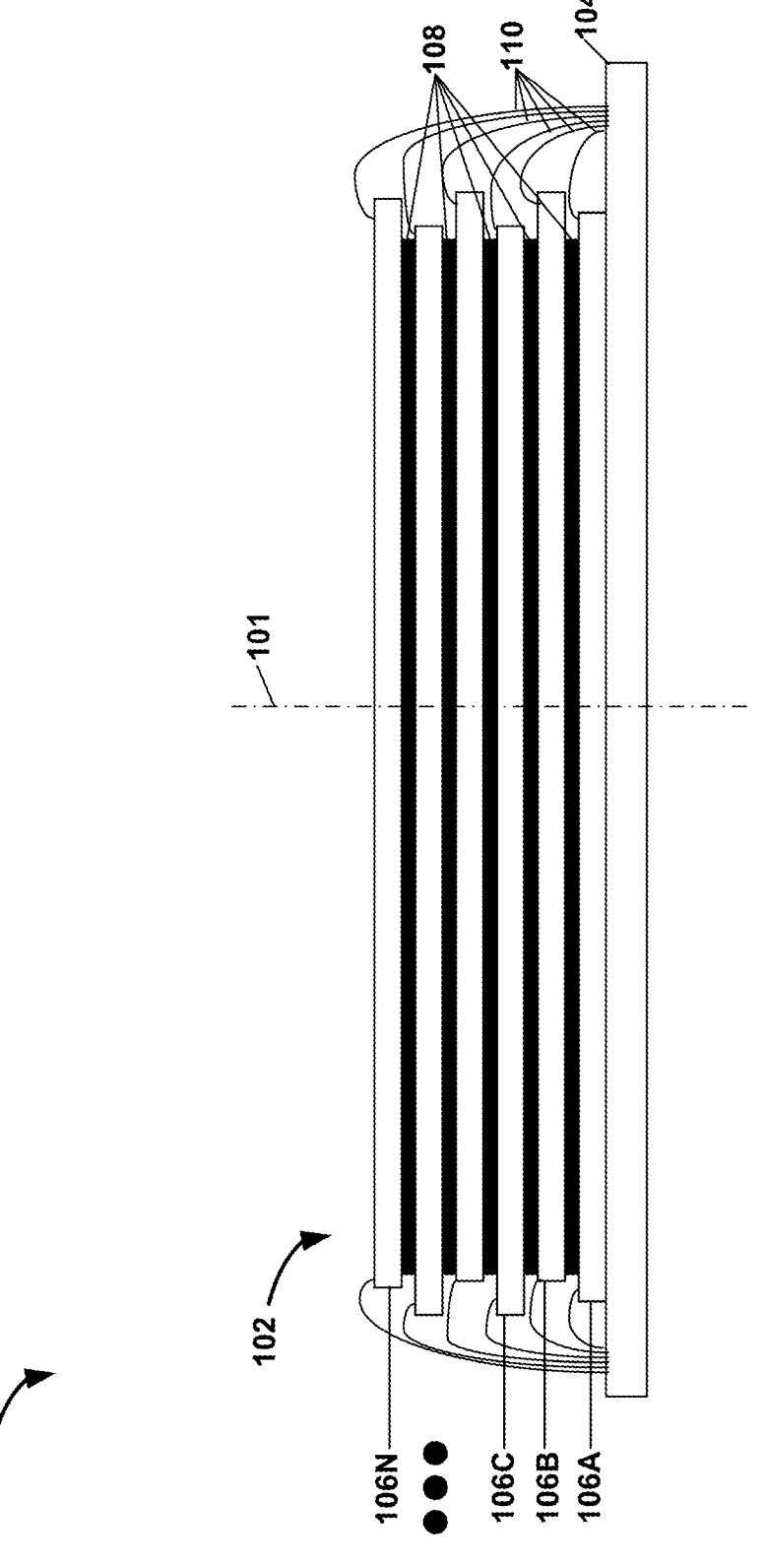
FIG. 1 is a conceptual diagram illustrating an example three-dimensional (3D) integrated circuit stack, in accordance with one or more aspects of this disclosure.

In general, the disclosure is directed to integrated circuit systems that include multiple integrated circuit (IC) dies and bonding layers between vertically adjacent IC dies and also directed to techniques for forming such integrated circuit systems. A plurality of ICs may be vertically stacked to form a three-dimensional (3D) IC assembly. Vertically adjacent ICs may be electrically coupled to each other, e.g., via one or more electrical contacts). Adjacent ICs of the 3D IC assembly may be connected by a bonding layer. The 3D IC assembly may be disposed on a substrate and components of each IC may be connected to a substrate via bonding wires. Adjacent ICs may be connected via electrical contacts disposed on the surfaces of the ICs.

A die may be a semiconductor chip containing an integrated circuit. Dice may be stack on top of each other to form a stacked die (also referred to herein as "chip stacking"), Chip stacking may reduce an amount area taken up by the dice, thereby reducing an overall profile of a computing device or increasing a number of ICs within a same area. Chip stacking may also increase performance of ICs, e.g., by reducing routing length of interconnections between ICs, thereby increase the speed of signal propagation and/or reduce noise in the propagated signals. Dice may be stacked via application flip chip, wire bonding, or other techniques.

Although the examples of this disclosure are primarily described with reference to IC dies, the devices, systems, and methods described herein may include other semiconductors and/or semiconductor assemblies.

Adjacent dice within a stack die may be affixed to each other via a bonding layer between the dice. Each die may include electrical contacts disposed on outer surfaces of the die. The electrical contacts my connect the die with another die (e.g., with electrical contacts of the another die, via bonding wires) and transmit signals between the dice. Within a stack die, each die may need to be relatively thin, e.g., to reduce a vertical profile of the stacked die and/or to improver signal propagation.

During operation, each die of a stacked die may generate heat as an output. Outputted thermal energy may transfer vertically throughout the stack die (e.g., through electrical contacts, through the bonding layers) and cause the stack die to define a thermal profile. Within the thermal profile, each die may define a junction temperature, e.g., at each surface of the die. Within the thermal profile, each stack die may include a reference thermal plane defining a maximum temperature within the stacked die.

A manufacturer may compare the maximum temperature to a maximum operating temperature of the dice and determine a thermal operating budget for the stacked die. The manufacturer may design the stacked die such that the maximum temperature is less than or equal to the maximum operating temperature, e.g., to prevent overheating and/or damage to dice within the stacked die. Each die defines a thermal conductivity value and may be allotted a thermal budget value based on the thermal conductivity. The manufacturer may select types of dice and/or a number of dice to include in a stacked die that such the net thermal budget value of the dice does not exceed the allocated thermal operating budget.

In some examples, higher maximum temperatures may reduce the thermal operating budget allocated to the die. In some examples, reductions in the thicknesses of the dice may increase thermal conductivity of the dice and, consequently, the thermal budget value of the dice. Reduced thermal operating budget and/or increased thermal conductivity of the dice may limit a number or type of dice included in the stacked die, thereby reducing the performance capabilities of the stacked die.

The example bonding layers described herein may include a mesh structure disposed between adjacent dice and electrical contacts extending from one or more of the adjacent dice. The mesh structure (alternatively referred to herein as "mesh" or "mesh interface") may include a plurality of interconnecting struts forming a plurality of openings defining the mesh. The mesh described herein may provide several benefits over other bonding layers. In some examples, the mesh may allow for horizontal propagation of thermal energy within the bonding layer (e.g., along the interconnecting struts). Increased horizontal propagation of thermal energy spreads a same amount of thermal energy across a greater surface area, thereby increasing the thermal resistance of dice. The increased horizontal propagation of thermal energy may also reduce an amount of thermal energy vertically propagated through the bonding layer, thereby increasing thermal resistance along the stacked die. The increased thermal resistance may reduce junction temperatures and create a more even temperature profile along the height of the stacked die, thereby reducing the maximum temperature and increasing the thermal operating budget.

The example bonding layers as described herein may provide other benefits over other bonding layers. In some examples, the mesh of the bonding layer improves stress relief between adjacent dice and increases flexibility of the stack die, thereby improving the strengths of bonds between dice and improving the structural integrity of the stacked die. In some examples, openings of the mesh may retain the electrical contacts of the dice and the interconnecting struts defining the openings may form hermetic seals with the dice. The hermetic seals around the electrical contacts may isolate the signals transmitted across the electrical contacts and reduce noise signals in the transmissions.

FIG. 1 is a conceptual diagram illustrating an example three-dimensional (3D) integrated circuit stack assembly 100 (also referred to herein as "stacked die assembly 100"), in accordance with one or more aspects of this disclosure. While FIG. 1 illustrates stack die assembly 100 formed using a wire bond technique, in other examples stack die assembly 100 may be formed via wire bond or other manufacturing techniques.

Stacked die assembly 100 includes a stacked die 102 disposed on a substrate 104. Stacked die includes a plurality of dice 106A-106N (collectively referred to as "dice 106"). Each of dice 106 is affixed to an adjacent die 106 via a bonding layer 108. Each die 106 of dice 106 may be electrically connected to adjacent dice 106 via electrical contacts (not pictured) disposed on an upper and/or lower surface of die 106. Each of dice 106 may be electrically connected to substrate 104 via bonding wire 110. Dice 106 within each stacked die 102 are stacked vertically along longitudinal axis 101 of stacked die 102.

Substrate 104 connects stacked die 102 to a circuit board. On a circuit board, each stacked die 102 may be disposed on a separate piece of substrate 104. In some examples, a single piece of substrate 104 may include two or more stacked die 102 or a stacked die 102 and one or more other ICs. Each substrate 104 may retain stacked die 102 on an upper surface of substrate 104 and may be affixed to a circuit board via a lower surface of substrate 104 (e.g., via solder material disposed on the lower surface of substrate 104). A proximal-most die 106 of dice 106 (e.g., a die 106 closest to substrate 104) may be attached to substrate 104 via a bonding layer (e.g., bonding layer 108) or a die attachment material (e.g., an epoxy adhesive).

Bonding layer 108 may affix one die 106 to another die 106. For example, bonding layer 108 may affix an upper surface of a more proximal die 106 to a lower surface of a more distal die 106. Bonding layer 108 may include electrical contacts extending from one or more of dice 106 and a mesh disposed between the adjacent dice 106. The mesh of bonding layer 108 may include a plurality of interconnecting struts defining a plurality of openings. The plurality of openings of the mesh may be aligned with electrical contacts on dice 106. When the mesh is affixed to dice 106, the electrical contacts of dice 106 may be disposed within the openings and hermetically sealed. The placement of the openings on the mesh may allow for connections between different types of die, e.g., between Application Specific Integrated Circuits (ASICs), between Commercially Off-The-Shelf (COTS) semiconductors, and/or between ASIC and COTS semiconductors. In some examples, the openings on the mesh may be adjusted to accommodate for the different types of die, e.g., to re-route between dice 106, to allow for specific connections between dice 106, to prevent specific connections between dice 106.

The interconnecting struts of the mesh may distribute thermal energy from one or more of dice 106 laterally along bonding layer 108. The lateral distribution of thermal energy may increase overall thermal resistance of each die 106 and/or stacked die 102. The interconnecting struts may distribute stress across bonding layer 108, e.g., to reduce stress between adjacent dice 106. The interconnecting struts may increase flexibility of bonding layer 108 and/or of one die 106 relative to an adjacent die 106. The increased stress distribution and/or increased flexibility may strength the bond formed by bonding layer 108 and/or increase the longevity of the bond formed by bonding layer 108.

The mesh may form a solder bond with each of dice 106. The mesh may include interconnecting struts formed from a solder material such as, but is not limited to, Tin. Each of the upper and lower surfaces of dice 106 may include a material configured to accept a solder material and form a solder bond. The material may include, but are not limited to, a Gold-Iridium alloy, a Gold-Tin alloy, or a Copper-Tin alloy. In other examples, the mesh may include interconnecting struts formed from an adhesive.

Bonding wire 110 may connect substrate 104 to dice 106 (e.g., to bond pads on dice 106). Each die 106 may be connected to substrate 104 via bonding wires 110 disposed on one edge of die 106. In some examples, each die 106 may be connected to substrate 104 via bonding wires 110 disposed on two or more edges of die 106. Bonding wire 110 may be a wire bonding material including, but are not limited to, aluminum or gold.

Each stacked die 102 and/or die 106 within a stacked die 102 may be formed with any properties suitable for a particular application for which a circuit board is intended. For example, stacked die 102 may be formed for application in, but is not limited to, an analog interposer chip, a microelectromechanical system (MEMS), an inertial sensor, a magnetic sensor, an electromagnetic sensor, a chemical sensor, a biological sensor, an acoustic sensor, an optical sensor, a radiation sensor, a radiofrequency (RF) link, a power source, dynamic random access memory (DRAM), a field programmable gate array (FPGA), a parallel computing resource, or any combination thereof.

Each die 106 may be configured for one or more of processing (e.g., co-processor or microprocessor die), memory (e.g., random access memory (RAM) or non-volatile memory (NVM)), power conditioning, ambient monitoring (e.g., temperature monitoring, health monitoring), sensing, encryption, optics-photonics, or non-volatile memory. Additionally, each die 106 may include RF IC devices, radiation-hardened devices, MEMS, or any combination thereof. Particular types of die 106 may be selected for stacked die 102 based on an intended application of stack die 102. For example, one application of stack die 102 may require the inclusion of more processing die 106 and another application may require the inclusion of more memory die 106.

Figure 2A:
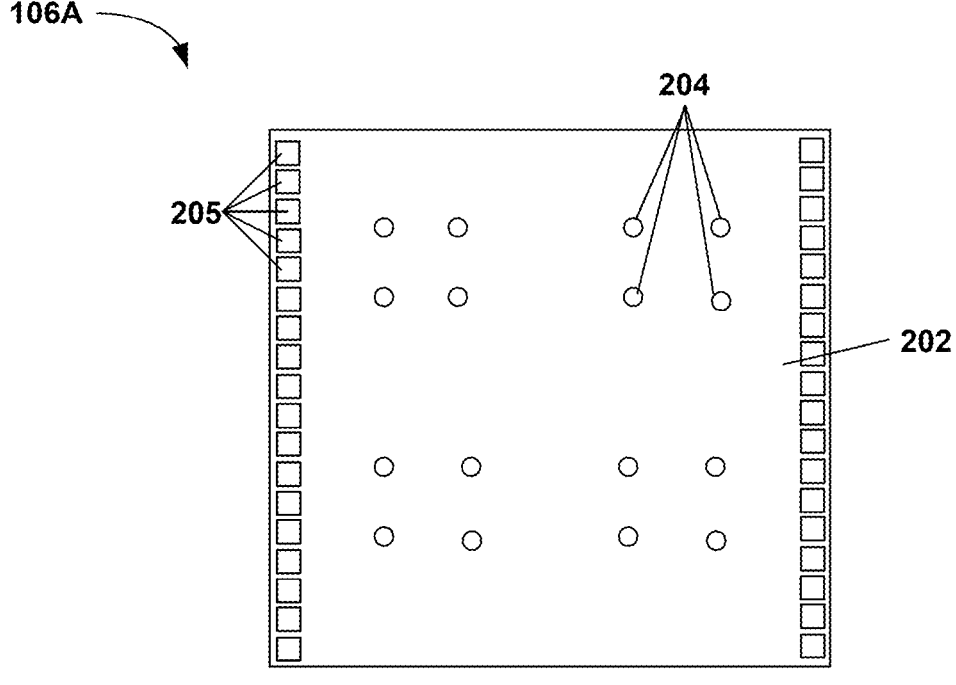
FIG. 2A is a perspective diagram illustrating a top-down view of an example die of FIG. 1.
Figure 2B:
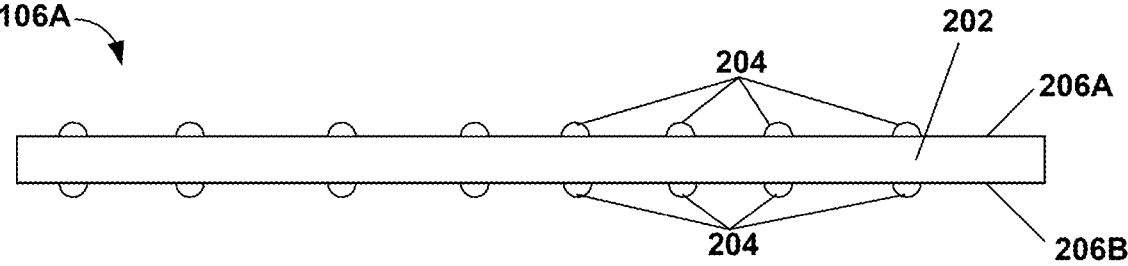
FIG. 2B is a perspective diagram illustrating a side view of the example die of FIG. 2A.

FIG. 2A is a perspective diagram illustrating a top-down view of an example die 106 of FIG. 1. FIG. 2B is a perspective diagram illustrating a side view of the example die 106 of FIG. 2A. As illustrated in FIG. 2A, die 106 includes a chip 202 including a plurality of electrical contacts 204 extruding from an outer surface 206A, 206B of chip 202 (collectively referred to as "outer surfaces 206"). Die 106 may include a plurality of electrical components (e.g., resistors, capacitors, diodes, and transistors) that are not illustrated in FIG. 2A.

Chip 202 may be formed from a semiconductor material including, but is not limited to, silicon, germanium, gallium arsenide, or the like. The plurality of electrical components may be disposed on, within, or partially within the semiconductor material. The plurality of electrical components may be electrically connected to electrical contacts 204, to bond pads 205, and/or to other electrical components of die 106.

Chip 202 may define a first outer surface 206A and a second outer surface 206B. One of outer surfaces 206 may define an upper surface of chip 202 and die 106 and another of outer surfaces 206 may define a lower surface of chip 202 and die 106. For example, outer surface 206A may define the upper surface of die 106 and outer surface 206B may define the lower surface of die 106. Outer surfaces 206 may be substantially parallel to each other. Each of outer surfaces 206 may be coated with a material configured to accept a solder bond including, but are not limited to, a Gold-Iridium alloy, a Gold-Tin alloy, or a Copper-Tin alloy.

Electrically conductive traces or other conducting elements may electrically connect electrical contacts 204, bond pads 205, and other electrical components of die 106. The electrically conductive traces or other conducting elements may be dispose on outer surfaces 206 of chip 202 and/or within chip 202. The electrically conductive traces or other conducting elements may facilitate electrical connection and communication between outer surfaces 206 of chip 202. In this way, each die 106 may include input and output for electrical signals on multiple sides of die 106.

Electrical contacts 204 extend away from outer surfaces 206. Each electrical contact 204 is configured to connect to an electrical contact 204 of another die 106. Electrical contact 204 may transmit signals to and/or receive signals from another die 106. Electrical contacts 204 may be formed from an electrically conductive material such as a Copper-Tin alloy. In some examples, as illustrated in FIG. 2B, each electrical contact 204 may be a microbump.

Each electrical contact 204 may be positioned at predetermined locations on chip 202. The predetermined locations may correspond to same locations on dice 106, e.g., to facilitate electrical connections between adjacent dies 106. The predetermined locations may correspond to same locations on ASIC or COTS semiconductors, e.g., to allow for electrical contacts between ASIC and/or COTS semiconductors. In some examples, some of electrical contacts 204 may be configured to, when die 106 is aligned with another die 106, electrically connect die 106 with die 106 of one type (e.g., an ASIC) and other electrical contacts 204 may be configured to electrically connect die 106 to die 106 of another type (e.g., a COTS semiconductor).

Die 106 may include bond pads 205 disposed along one or more edges of chip 202. Each of bond pads 205 may be configured to retain one end of a bonding wire 110 and electrically connect bonding wire 110 to electrical components of die 106.

Figures 3A, 3B:
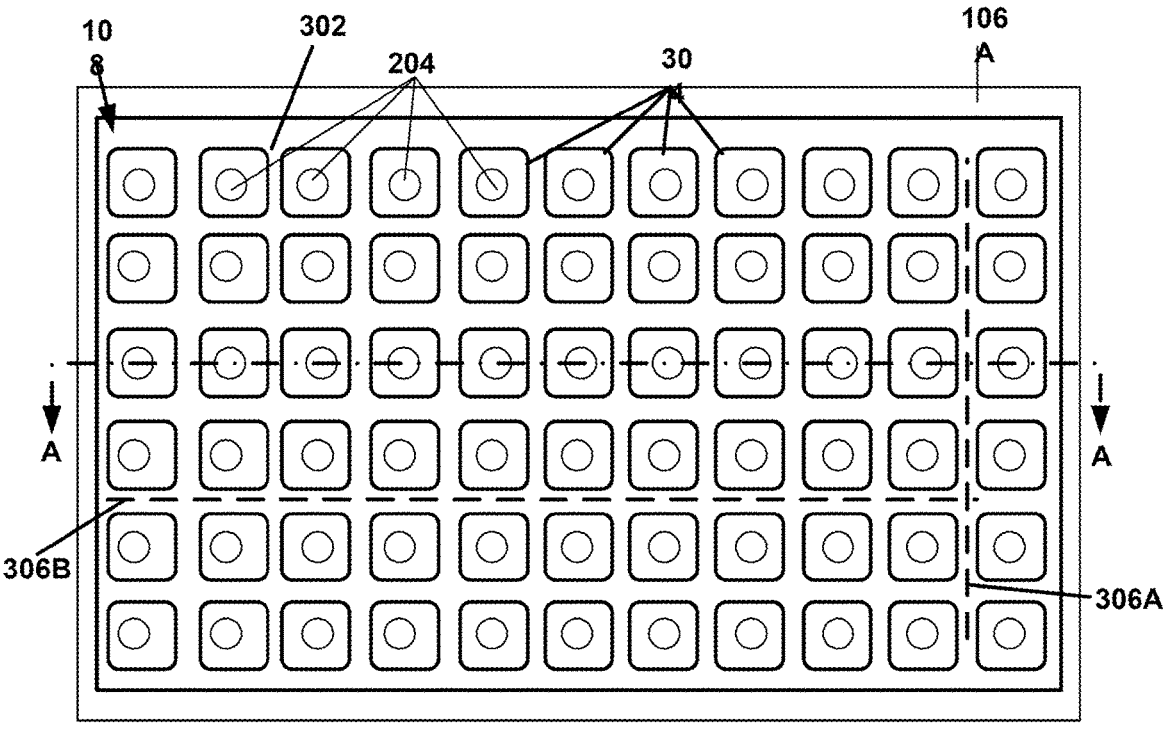
FIG. 3A is a perspective diagram illustrating a top-down view of an example mesh disposed on an example die of FIG. 2A.
FIG. 3B is a cross-sectional diagram illustrating a cross-section of the example mesh of FIG. 3A, the cross-section being taken along line A-A of FIG. 3A.

FIG. 3A is a perspective diagram illustrating a top-down view of an example mesh of bonding layer 108 disposed on a die 106 (e.g., die 106B) of FIG. 2A. FIG. 3B is a cross-sectional diagram illustrating a cross-section of the example mesh and die 106B of FIG. 3A, the cross-section being taken along line A-A of FIG. 3A.

As illustrated in FIG. 3A, bonding layer 108 includes a mesh 302 defining a plurality of struts 306A and 306B (collectively referred to as "struts 306"). Mesh 302 may include a solder material (e.g., Tin) or an adhesive material. Mesh 302 may be configured to be affixed to outer surfaces 206 of dice 106. In some examples, an adhesive material may be disposed on outer surfaces 310A, 310B of bonding material (as illustrated in FIG. 3B, hereinafter referred to as "outer surfaces 310"). The adhesive material may be configured to be affixed to surfaces 206 of dice 106.

Mesh 302 may define an underfill layer between dice 106. The underfill layer increases the strength of bonds between bonding layer 108 and dice 106. The Underfill layer may also increase a reliability of electrical connections between electrical contacts 204.

Struts 306 are interconnecting and may define a plurality of openings 304 in bonding material 308. While FIG. 3A illustrates a mesh defined by struts 306A and 306B orthogonal to each other and parallel to the edges of mesh 302, in other examples, struts 306 defining the mesh may be offset at an angle less than 90 degrees from one or more edges of mesh 302 and/or another strut (e.g., a strut 306A, a strut 306B).

Each of struts 306 may be configured to transmit thermal energy and/or physical forces along a length of strut 306. At each interconnection between struts 306, one strut 306 (e.g., strut 306A) may transmit thermal energy and/or physical forces to another strut 306 (e.g., strut 306B), thereby distributing thermal energy and/or physical forces over a greater area of mesh 302. Distribution of the thermal energy over a greater area may increase the thermal resistance of bonding layer 108 and, by extension, stacked die 102. The distribution of the physical forces over a greater area of mesh 302 may reduce a stress concentration over any particular region of bonding layer 108, thereby increasing stress relief capabilities of bonding layer 108. The shape and dimensions of each strut 306 may allow mesh 302 for greater transmission of thermal energy and/or physical forces than a solid piece of mesh 302.

Each of struts 306 may extend partially or entirely across a surface of mesh 302. In some examples, struts 306 may form a continuous pattern of openings 304 across an entire surface of mesh 302. In some examples, struts 306 may define one pattern of openings 304 across one portion of a surface of mesh 302 and another pattern of openings 304 across another portion of the surface. Within each pattern of openings 304, openings 304 may be of the same shape and/or dimensions or may be of different shapes and/or dimensions. For example, openings 304 may have shapes including, but are not limited to, circular shapes, triangular shapes, rectangular shapes, pentagonal shapes, hexagonal shapes, octagonal shapes, or any combination thereof. At least some of openings 304 may align with electrical contacts 204 disposed on die 106 and/or with electrical contacts 204 on different types of die 106 (e.g., with electrical contacts 204 on different COTS semiconductors and/or ASICs).

In some examples, struts 306 may form a continuous mesh, e.g., such that thermal energy and/or electrical signal may be transmitted from one location on mesh 302 to any other location on mesh 302 via one or more of struts 306. In some examples, one or more of struts 306 may be electrically or thermally separated or isolated from one or more other struts 306 of mesh 302.

In some examples, struts 306 may be formed from a single bonding material 305. Bonding material 305 may be a solder material (e.g., Tin) or an adhesive material. In some examples, struts 306 may be formed from two or more bonding materials 307A-B (collectively referred to as "bonding materials 307"). Bonding materials 307 may be disposed on surfaces of different dice 106. For example, bonding material 307A may be disposed on outer surface 206A of die 106B and bonding material 307B may be disposed on outer surface 206B of die 106C (not pictured in FIG. 3B). Bonding materials 307 may be placed in contact and affixed to each other (e.g., via the application of thermal energy) to form struts 306, and thereby mesh 302. While FIG. 3B illustrates struts 306 formed from two bonding materials 307, other example struts 306 may be formed from three or more bonding materials 307. Struts 306 of mesh 302 may be formed entirely from bonding material 305 or entirely from bonding materials 307. In some examples, mesh may include some struts 306 formed from bonding material 305 and other struts 306 formed from bonding materials 307.

As illustrated in FIG. 3B, each opening 304 may extend from one outer surface 310A to another outer surface 310B of mesh 302. Outer surfaces 310 may be substantially parallel to each other. In some examples, depending on the configuration of stacked die 102, outer surfaces 310 may be offset from each other by an angle.

Each opening 304 may define an inner diameter (ID) 312. Openings 304 may have a same ID 312 or may have different IDs 312. ID 312 may be sized to allow placement of electrical contacts 204 into openings 304. In some examples, as illustrated in FIG. 3B, each of openings 304 may define a constant ID 312 along longitudinal axis 101. In some examples, one or more of openings 304 may define a varying ID 312 along longitudinal axis 101. For example, the one or more of openings 304 may define a taper from one outer surface 310 to another outer surface 310 or from outer surfaces 310 to a reference point between outer surfaces 310 and within mesh 302. The taper may increase volumes and cross-section areas of struts 306, thereby increasing the strength, stress relief properties, and thermal resistance of bonding layer 108.

Mesh 302 may define a depth along longitudinal axis 101. The depth may be greater than or equal to a minimum depth required to allow electrical contacts 204 of adjacent dice 106 to contact and electrically couple. Increased depth of mesh 302 may increase the thermal resistance of bonding layer 108, e.g., by increasing the volume of each of struts 306 of mesh 302.

Outer surfaces 310 of mesh 302 may form a hermetic seal with outer surfaces 206 of dice 106, e.g., such that each of openings 304 is isolated from an external environment surrounding stacked die 106. Isolation of each of openings 304 also isolates electrical contacts 204 disposed within openings 304 from external interference (e.g., external signal noise), thereby improving signal transmission between dice 106 via electrical contacts 204.

Figure 4A:
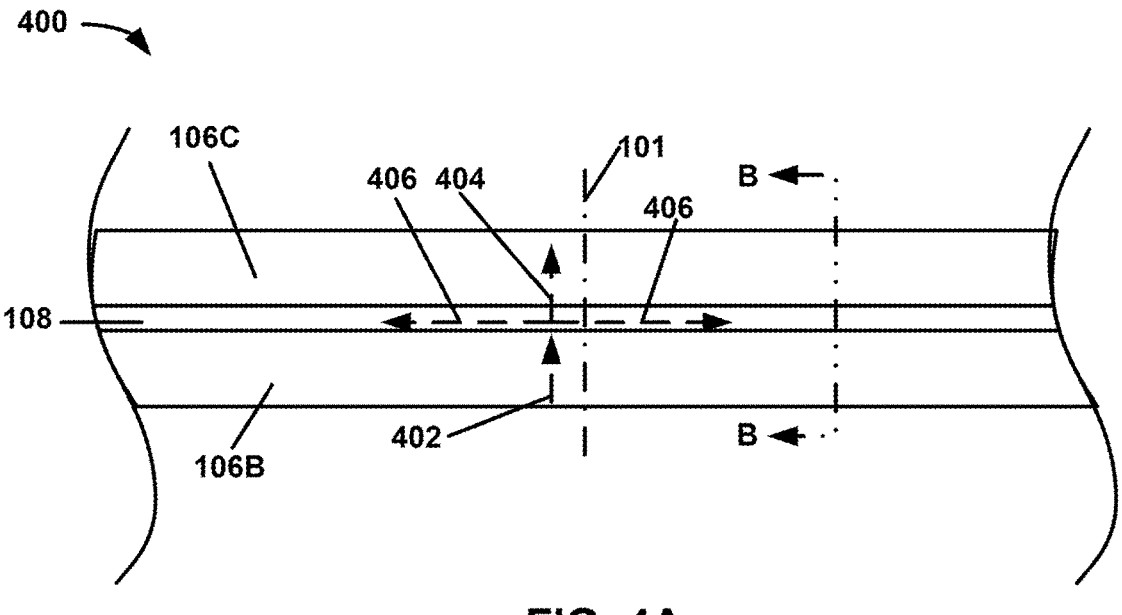
FIG. 4A is a perspective diagram illustrating a side view of a portion of the stacked die of FIG. 1.
Figure 4B:
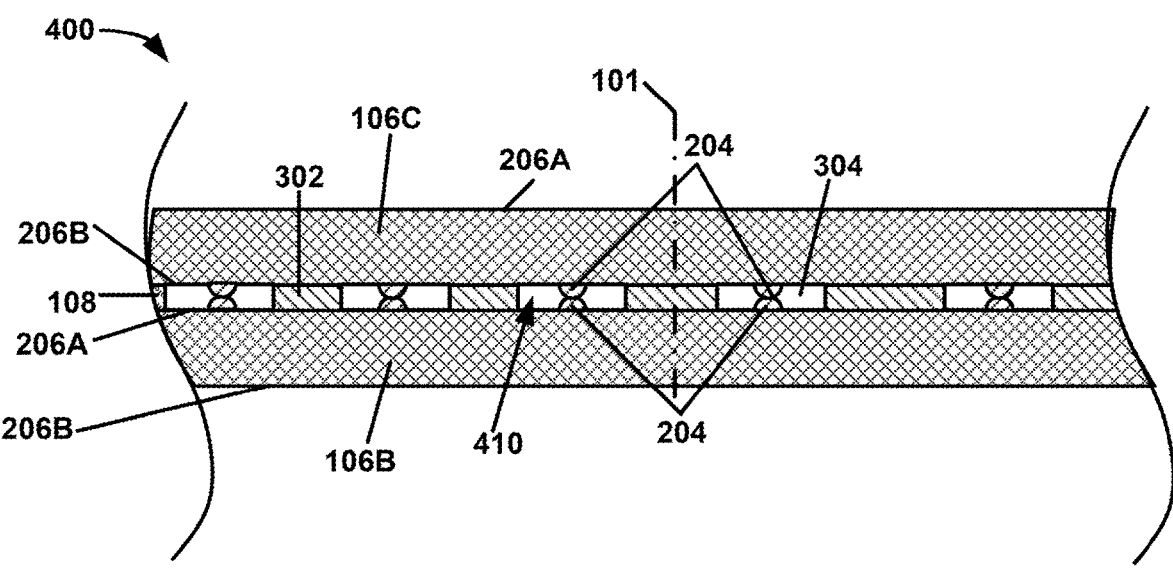
FIG. 4B is a cross-sectional diagram illustrating a cross-section of the portion of stacked die of FIG. 4A, the cross-section being taken along line B-B of FIG. 4A.

FIG. 4A is a perspective diagram illustrating a side view of a portion 400 of stacked die 102 of FIG. 1. FIG. 4B is a cross-sectional diagram illustrating a cross-section of the portion 400 of stacked die 102 of FIG. 4A, the cross-section being taken along line B-B of FIG. 4A. FIGS. 4A and 4B illustrate portion 400 of stacked die 102 including dice 106B and 106C, although the descriptions herein may be applied to any other two dice 106 and/or between a die 106 (e.g., die 106A) and substrate 104.

Vertically adjacent dice 106 (e.g., dice 106B and 106C of FIG. 4A) are adjacent to each other along longitudinal axis 101. The adjacent dice 106 are affixed to and separated by bonding layer 108. Thermal energy and/or physical forces may be transmitted from one die 106 (e.g., die 106B) to an adjoining bonding layer 108 along direction 402. Direction 402 may be substantially parallel to longitudinal axis 101. Die 106B may transmit the thermal energy and/or physical forces from one or more locations on an outer surface of die 106B into bonding layer 108 in direction 402.

Once bonding layer 108 receives the thermal energy and/or physical forces from die 106B, bonding layer 108 may transmit portions of the thermal energy and/or physical forces to another die 106 (e.g., die 106C) along direction 404 and within bonding layer 108 along directions 406. Direction 404 may be substantially parallel to longitudinal axis 101 and may also be referred to herein as "vertical direction 404". Directions 406 may be substantially orthogonal to longitudinal axis 101 and parallel to outer surfaces of bonding layer 108 and/or dice 106. Direction 406 may also be referred to herein as "horizontal directions 406". While FIG. 4A illustrates horizontal directions 406 in two directions along axes orthogonal to longitudinal axis 101, horizontal directions 406 may extend in any direction along a reference plane orthogonal to longitudinal axis 101.

An amount of thermal energy transmitted along vertical direction 404 and horizontal directions 406 may be substantially the same as an amount of thermal energy received by bonding layer 108 from die 106B. In some examples, an amount of thermal energy may be lost (e.g., dissipated) during the transmission of thermal energy from die 106B to bonding layer 108 and/or from bonding layer 108 to die 106C. An amount of thermal energy received by die 106C may be equivalent to an amount of thermal energy transmitted by die 106B less any dissipated thermal energies and the thermal energies distributed along horizontal directions 406. The distribution of thermal energies along horizontal directions 406 reduces an amount of thermal energy transmitted to die 106C, thereby reducing a junction temperature between die 106C and bonding layer 108. The reduced transmission of thermal energy to die 106C may also increase the thermal resistance of bonding layer 108 and reduce a maximum temperature of dice 106C, thereby increasing a thermal budget of stacked die 102.

Bonding layer 108 may transmit thermal energies in horizontal directions 406 along interconnecting struts (e.g., struts 306 of FIG. 3A) of mesh 302. The interconnecting struts allow the distribution of an amount of thermal energy over a greater surface area of mesh 302 and reduces an amount of thermal energy transmitted from bonding layer 108 to die 106C. In some examples, as illustrated in FIG. 4B, openings 304 within bonding layer 108 may include air within each opening 304. The air may be hermetically sealed via the bonds between dice 106 and mesh 302 of bonding layer 108. The air within openings 304 may provide additional insulation between die 106B and die 106C, thereby further increasing the thermal resistance of bonding layer 108.

Dice 106 may exert physical forces on adjacent dice 106, thereby increasing stress on each die 106. The effects of the stress on each die 106 may reduce an operational lifespan of die 106. As illustrated in FIG. 3A, die 106B may transmit physical forces to bonding layer 108 along direction 402. Die 106B may exert the physical force on bonding layer 108 at a specific point on outer surface 206A, at a plurality of points on outer surface 206A, or across at least a portion of outer surface 206A.

Within bonding layer 108, the force from die 106B may be distributed along interconnecting struts 306 of mesh 302 along horizontal directions 406. Bonding layer 108 may then transmit the forces to die 106C over a greater surface area. The distribution of the force from die 106B may spread a same magnitude of force over the greater area of bonding layer 108, thereby reducing stress at any particular point of outer surface 206B of die 106C.

In some examples, signals may be transmitted from die 106B to bonding layer 108 in direction 402. Bonding layer 108 may transmit signals along vertical direction 404 and/or along horizontal directions 406, e.g., to aid the transmission and/or lateral routing of signals within bonding layer 108. Bonding layer 108 may transmit the signals along struts 306 of mesh 302.

As illustrated in FIG. 4B, electrical contacts 204 of dice 106 may make contact and electrically couple with each other in openings 304 of mesh 302. The distribution of thermal energy and/or force in horizontal directions 406, e.g., via struts 306 of mesh 302, may reduce the concentration of thermal energy and/or stress on electrical contacts 204, thereby increasing operational lifespans of electrical contacts 204.

Figure 5:
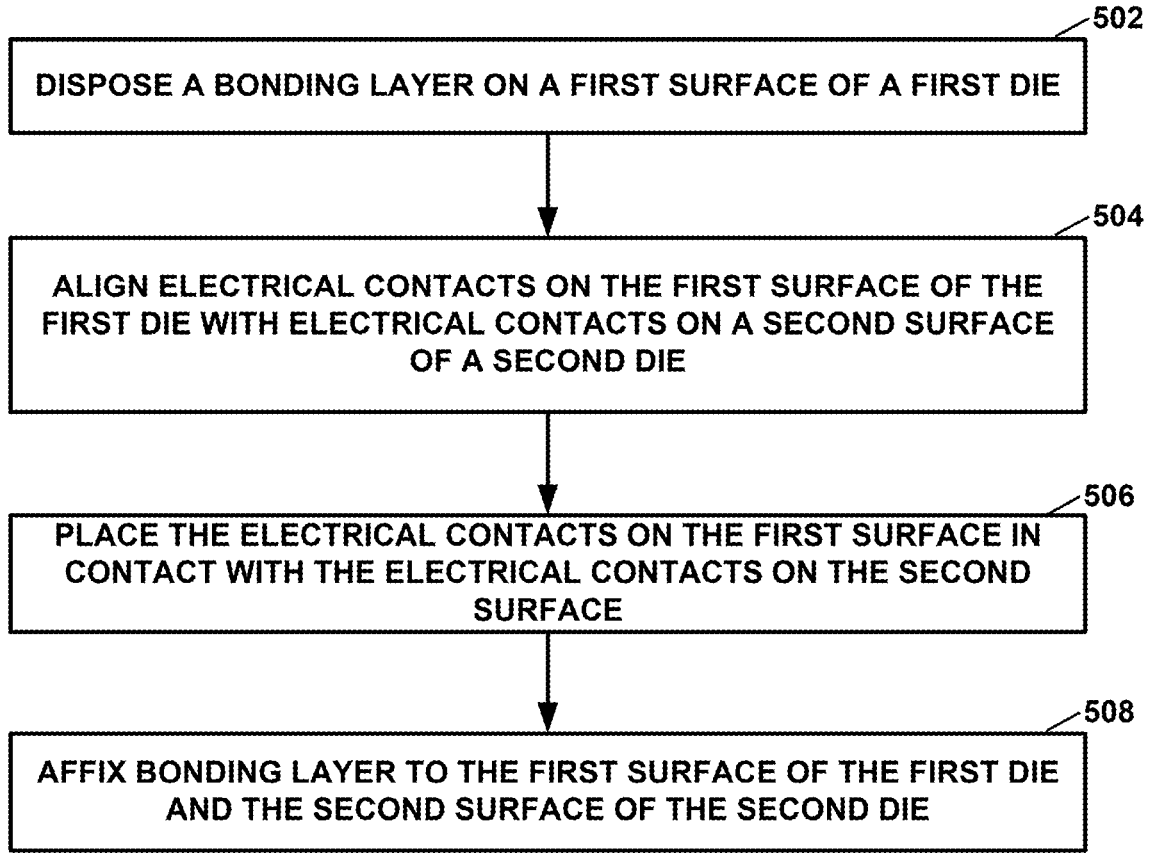
FIG. 5 is a flow diagram illustrating an example process for manufacturing a stacked die of any of FIGS. 1-4B.

FIG. 5 is a flow diagram illustrating an example process for manufacturing a stacked die 102 of any of FIGS. 1-4B. While FIG. 5 illustrates a process for manufacturing a stacked die 102 using a plurality of dies 106, a similar process may be applied to manufacture a stacked semiconductor assembly including a plurality of semiconductors. In addition, a similar process to the one illustrated in FIG. 5 may be applied to attach an IC, die 106, or semiconductor to substrate 104.

A manufacturer may dispose a mesh 302 on a first surface of a first die 106 (e.g., die 106B) (502). The first surface of first die 106 may be an outer surface (e.g., outer surface 206) of die 106B. Outer surface 206 may be an upper outer surface 206A or a lower outer surface 206B of die 106B. Outer surfaces 206 of die 106B may include a material and/or coating configured to form a bond with bonding layer 108. The material and/or coating on outer surfaces 206 may be configured to accept an adhesive and/or a solder bond with bonding layer 108.

Die 106B may include a pre-existing die 106 (e.g., an COTS semiconductor, an ASIC) or a custom die 106. Die 106B may include a plurality of electrical contacts 204 disposed on and extending away from outer surfaces 206. Electrical contacts 204 may be configured to receive signals from other dies 106 and/or a substrate 104 and transmit the signals to one or more computing components of die 106B, e.g., via electrically conductive traces or other electrically conductive materials. Electrical contacts 204 may be placed on standardized locations on outer surfaces 206 and/or at customized locations on outer surfaces 206, e.g., based on the intended use of die 106B. Mesh 302 may be formed from one or more bonding materials (e.g., bonding material 305, bonding materials 307) configured to affix an outer surface 310 of mesh 302 to outer surface 206 of die 106B. The fixation material may include, but is not limited to, a solder material (e.g., Tin) or an adhesive.

Mesh 302 may include interconnecting struts 306 defining a plurality of openings 304. Each of openings 304 may extend from one of outer surfaces 310 to the other of outer surfaces 310. Openings 304 may define an ID 312 configured to retain electrical contacts 204 disposed on outer surface 206 of die 106B.

The manufacturer may dispose bonding layer 108 on the first surface of die 106B by aligning a preformed bonding layer 108 with the first surface of die 106B and placing bonding layer 108 directly onto the first surface. The manufacturer may align the bonding layer 108 with the first surface of die 106B may aligning at least some of openings 304 of the mesh of bonding layer 108 with electrical contacts 204 on the first surface.

In some examples, the manufacturer may form bonding layer 108 on the first surface of die 106B. The manufacturer may form individual struts 306 on the first surface of die 106B, e.g., to form a mesh of bonding layer 108. When fully formed, the mesh may define a plurality of openings 304, at least some of openings 304 surrounding and at least partially encapsulating electrical contacts 204 on bonding layer 108.

In some examples, one of bonding materials 307 (e.g., bonding material 307A) may be disposed on the first surface of die 106B and another of bonding materials 307 (e.g., bonding material 307B) may be disposed on a second surface of a die 106 adjacent to die 106B (e.g., die 106A, die 106C) In such examples, when the adjacent dice 106 are placed in contact with one another, bonding materials 307 may adhere with one another to form struts 306 of mesh 302.

In some examples, one or more of struts 306 may be thermally or electrically isolated from another of struts 306. In such examples, the manufacturer may determine the placement of mesh 302 on the first surface of die 106B based at least in part on the desired placement of the isolated struts 306 on the first surface, e.g., to isolate particular portions of die 106B and/or an adjacent die 106 from the transmission of thermal energy and/or electrical signals along struts 306 of mesh 302.

The manufacturer may align electrical contacts 204 on the first surface of the first die 106B with electrical contacts 204 on a second surface of second die 106C (504). Dice 106B and 106C may be a same type of die 106 (e.g., ASIC, COTS semiconductor), or may be off different types. In some examples, Dice 106B and 106C may be of a same type but may be configured to perform different functions such that the placement of electrical contacts 204 on outer surfaces of dice 106B and 106C are different.

The manufacturer may align each electrical contact 204 on the first surface (e.g., upper outer surface 206A) of die 106B with an electrical contact 204 on the second surface (e.g., lower outer surface 206B) of die 106B. In some examples, certain electrical contacts 204 on one or more of dice 106B and 106C are aligned with electrical contacts 204 on the other of dice 106B and 106C, e.g., to prevent unintended electrical connections between dice 106B and 106C. The specific alignment of electrical contacts 204 of dice 106B and 106C may be based on the types of each of dice 106B and 106C and/or an intended function of each of dice 106B and 106C.

The manufacturer may place electrical contacts 204 on the first surface of die 106B in contact with electrical contacts 204 on the second surface of die 106C (506). In some examples, as illustrated in FIG. 4B, electrical contacts 204 may be placed in direct contact. In some examples, an electrically conductive intermediary material (e.g., a solder material) may be disposed between the electrical contacts 204 and form the contact between the electrical contacts 204. The contacting electrical contacts 204 may transmit and/or rout signals between dice 106B and 103C.

The contacting electrical contacts 204 are surrounded by interconnecting struts 306 of bonding layer 108 defining an opening 304. The mesh formed by interconnecting struts 306 may form hermetic seals around electrical contacts 204 with the first surface of die 106B and with the second surface of die 106C. The hermetic seals may isolate the contacting electrical contacts 204, e.g., from the external environment, from external signals, and improve signal transmission and/or routing between dice 106B and 106C.

The manufacturer may then affix mesh 302 to the first surface of first die 106B and to the second surface of second die 106C (508). Affixing mesh 302 to dice 106B and 106C forms a bonding layer 108 between dice 106B and 106C and forms stacked die assembly (e.g., a portion or all of stacked die 102). Bonding layer 107 may include mesh 302 and electrical contacts 204. The bond may cause dice 106B and 106C to maintain consistent electrical contact and structural integrity.

In some examples, where mesh 302 includes an adhesive, the manufacturer may apply a force to dice 106B and 106C or otherwise cause the adhesive to adhere to the first and second surfaces, thereby forming bonding layer 108.

In some examples, where mesh 302 includes a solder material, the manufacturer may apply heat to mesh 302 to cause the solder material to react. The manufacturer may then cool the solder material to form bonds between the solder material and the first and second surfaces of dice 106B and 106C.

In some examples, instead of placing a preformed mesh 302 on die 106B to form bonding layer 108, the manufacturer may instead place a solder material (e.g., a solder paste) on one or more of die 106B or die 106C. The manufacturer may then align electrical contacts 204 on the first surface of die 106B with electrical contacts 204 on the second surface of die 106C and place the electrical contacts 204 into contact with each other, e.g., as described above. The manufacturer may then heat the solder material to form bonding layer 108 in a solder reflow process. In such examples, the manufacturer may heat the solder material to cause a liquified solder material to flow between the contacting electrical contacts 204. When the solder material cools, the solder material may form struts 306 of mesh 302.

The manufacturer may place the solder paste on a specific region on die 106B or place the solder paste across the first surface of die 106B, e.g., in a shape corresponding to struts 306 and/or the mesh. The manufacturer may heat the solder material up to a eutectic temperature of the solder material, e.g., to liquify the solder material and form bonding layer 108. In some examples, the manufacturer may place a first bonding material 307A (e.g., a solder material, a solder paste) across the first surface of die 106B and may place a second bonding material 307B (e.g., another solder material or solder-compatible material) across the second surface of die 106C. The manufacturer may then align die 106B with die 106C such that first and second bonding materials 307A. 307B form a pattern corresponding to struts 306 of mesh 302. The manufacturer may then heat bonding materials 307A, 307B to form a bond between bonding materials 307A, 307B and between dice 106B, 106C.

The techniques of this disclosure may also be described in the following examples.

Example 1

A stacked semiconductor assembly comprising: a first semiconductor having a plurality of electrical contacts extending from an upper surface of the first semiconductor; a second semiconductor adjacent to the first semiconductor, wherein a lower surface of the second semiconductor is electrically connected to the first semiconductor via the plurality of electrical contacts; and a mesh disposed between and affixed to the upper surface of the first semiconductor and the lower surface of the second semiconductor, wherein the mesh comprises a plurality of interconnecting struts defining a plurality of openings, and wherein of the plurality of openings are configured to receive the plurality of electrical contacts.

Example 2 the stacked semiconductor assembly of example 1, wherein the mesh forms a hermetic seal with the upper surface of the first semiconductor and with the lower surface of the second semiconductor.

Example 3 the stacked semiconductor assembly of any of examples 1 and 2, wherein each electrical contact of the plurality of electrical contacts comprises a microbump.

Example 4 the stacked semiconductor assembly of any of examples 1-3, wherein at least one of the first semiconductor and the second semiconductor comprises an application specific integrated circuit (ASIC).

Example 5 the stacked semiconductor assembly of any of examples 1-4, wherein at least one of the first semiconductor and the second semiconductor comprises a commercial off-the-shelf (COTS) semiconductor.

Example 6 the stacked semiconductor assembly of any of examples 1-5, wherein the plurality of interconnecting struts comprises a solder material.

Example 7 the stacked semiconductor assembly of any of examples 1-6, wherein the plurality of interconnecting struts comprises an adhesive material.

Example 8 the stacked semiconductor assembly of any of examples 1-7, wherein the mesh is configured to distribute thermal energy along the plurality of interconnecting struts.

Example 9 the stacked semiconductor assembly of any of examples 1-8, wherein the mesh distributes electrical signals along the plurality of interconnecting struts and between the first semiconductor and the second semiconductor.

Example 10 the stacked semiconductor assembly of any of examples 1-9, wherein each of the plurality of openings of the mesh defines an adjustable diameter.

Example 11 the stacked semiconductor assembly of any of examples 1-10, wherein the mesh comprises a first mesh, wherein the plurality of electrical contacts comprises a first plurality of electrical contacts, wherein the plurality of openings comprises a first plurality of openings, wherein the plurality of interconnecting struts comprises a first plurality of interconnecting struts, and wherein the stacked semiconductor assembly further comprises: a third semiconductor adjacent to the second semiconductor, wherein a lower surface of the third semiconductor is electrically connected to an upper surface of the second semiconductor via a second plurality of contacts extending from the lower surface of the third semiconductor; and a second mesh disposed between and affixed to the upper surface of the second semiconductor and the lower surface of the third semiconductor, wherein the second mesh comprises a plurality of second interconnecting struts defining a plurality of second openings configured to receive the second plurality of electrical contacts.

Example 12 the stacked semiconductor assembly of any of examples 1-11, wherein the mesh and the plurality of electrical contacts define a bonding layer between the first semiconductor and the second semiconductor.

Example 13 a semiconductor mesh interface comprising: an adhesive material comprising a plurality of interconnecting struts defining a plurality of openings extending from a first surface of the adhesive material to a second surface of the adhesive material, wherein the first surface of the adhesive material is configured to be affixed to an upper surface of a first semiconductor, wherein the second surface of the adhesive material is configured to be affixed to a lower surface of a second semiconductor, wherein one or more of the plurality of openings is configured to receive electrical contacts extending between the first semiconductor and the second semiconductor.

Example 14 the semiconductor mesh interface of example 13, wherein the first surface of the adhesive material is configured to form a first hermetic seal with the upper surface of the first semiconductor, and wherein the second surface of the adhesive material is configured to form a second hermetic seal with the lower surface of the second semiconductor.

Example 15 the semiconductor mesh interface of any of examples 13 and 14, wherein the adhesive material comprises a solder material.

Example 16 the semiconductor mesh interface of example 15, wherein the solder material comprises tin.

Example 17 the semiconductor mesh interface of any of examples 13-16, wherein the adhesive material is configured to distribute thermal energy along the plurality of interconnecting struts and throughout a volume of the adhesive material.

Example 18 the semiconductor mesh interface of any of examples 13-17, wherein the adhesive material is configured to transmit electrical signals from a first location on the upper surface of the first semiconductor to a second location on the lower surface of the second semiconductor via the plurality of interconnecting struts.

Example 19 a method comprising: disposing a mesh over a first surface of a first semiconductor, wherein the mesh comprises: an adhesive material comprising a plurality of interconnecting struts defining a plurality of openings, wherein when the mesh is disposed over the first surface of the first semiconductor, the plurality of openings is configured to receive a first plurality of electrical contacts extending from the first surface of the first semiconductor; aligning a second plurality of electrical contacts extending from a second surface of a second semiconductor with the first plurality of electrical contacts of the first semiconductor; electrically connecting the first semiconductor with the second semiconductor via the first plurality of electrical contacts and the second plurality of electrical contacts; and affixing a first surface of the mesh to the first surface of the first semiconductor and a second surface of the mesh to the second surface of the second semiconductor.

Example 20 the method of example 19, wherein the adhesive material comprises a solder material.

Example 21 the method of any of examples 19 and 20, wherein one or more of the first plurality of electrical contacts and the second plurality of electrical contacts comprises microbumps.

Example 22 the method of any of examples 19-21, wherein: affixing the first surface of the mesh to the first surface of the first semiconductor comprises forming a first hermetic seal between the first surface of the mesh and the first surface of the first semiconductor; and affixing the second surface of the mesh to the second surface of the second semiconductor comprises forming a second hermetic seal between the second surface of the mesh and the second surface of the second semiconductor.

Various examples have been described. These and other examples are within the scope of the following claims.

What is claimed is:

1. A stacked semiconductor assembly comprising:
a first semiconductor having a plurality of electrical contacts extending from an upper surface of the first semiconductor;
a second semiconductor adjacent to the first semiconductor, wherein a lower surface of the second semiconductor is electrically connected to the first semiconductor via the plurality of electrical contacts; and
a mesh disposed between and affixed to the upper surface of the first semiconductor and the lower surface of the second semiconductor, wherein the mesh comprises a plurality of interconnecting struts defining a plurality of openings, and wherein the plurality of openings is configured to receive the plurality of electrical contacts, wherein the mesh is configured to affix the first semiconductor to the second semiconductor.

2. The stacked semiconductor assembly of claim 1, wherein the mesh forms a hermetic seal with the upper surface of the first semiconductor and with the lower surface of the second semiconductor around each opening of the plurality of openings.

3. The stacked semiconductor assembly of claim 1, wherein each electrical contact of the plurality of electrical contacts comprises a microbump.

4. The stacked semiconductor assembly of claim 1, wherein at least one of the first semiconductor or the second semiconductor comprises an application specific integrated circuit (ASIC).

5. The stacked semiconductor assembly of claim 1, wherein at least one of the first semiconductor or the second semiconductor comprises a commercial off-the-shelf (COTS) semiconductor.

6. The stacked semiconductor assembly of claim 1, wherein the plurality of interconnecting struts comprises a solder material.

7. The stacked semiconductor assembly of claim 1, wherein the mesh is configured to distribute thermal energy along the plurality of interconnecting struts.

8. The stacked semiconductor assembly of claim 1, wherein the mesh distributes electrical signals along the plurality of interconnecting struts and between the first semiconductor and the second semiconductor.

9. The stacked semiconductor assembly of claim 1, wherein each of the plurality of openings of the mesh defines an adjustable diameter.

10. The stacked semiconductor assembly of claim 1, wherein the mesh comprises a first mesh, wherein the plurality of electrical contacts comprises a first plurality of electrical contacts, wherein the plurality of openings comprises a first plurality of openings, wherein the plurality of interconnecting struts comprises a first plurality of interconnecting struts, and wherein the stacked semiconductor assembly further comprises:

a third semiconductor adjacent to the second semiconductor, wherein a lower surface of the third semiconductor is electrically connected to an upper surface of the second semiconductor via a second plurality of electrical contacts extending from the lower surface of the third semiconductor; and a second mesh disposed between and affixed to the upper surface of the second semiconductor and the lower surface of the third semiconductor, wherein the second mesh comprises a plurality of second interconnecting struts defining a plurality of second openings configured to receive the second plurality of electrical contacts.

11. The stacked semiconductor assembly of claim 1, wherein the mesh and the plurality of electrical contacts define a bonding layer between the first semiconductor and the second semiconductor.

12. A semiconductor mesh interface comprising:

an adhesive material comprising a plurality of interconnecting struts defining a plurality of openings extending from a first surface of the adhesive material to a second surface of the adhesive material, wherein the first surface of the adhesive material is configured to be affixed to an upper surface of a first semiconductor, wherein the second surface of the adhesive material is configured to be affixed to a lower surface of a second semiconductor, wherein one or more of the plurality of openings is configured to receive electrical contacts extending between the first semiconductor and the second semiconductor, and wherein the adhesive material is configured to affix the first semiconductor to the second semiconductor.

13. The semiconductor mesh interface of claim 12, wherein the first surface of the adhesive material is configured to form a first hermetic seal with the upper surface of the first semiconductor around a first end of a first opening of the plurality of openings, and wherein the second surface of the adhesive material is configured to form a second hermetic seal with the lower surface of the second semiconductor around a second end of the first opening of the plurality of openings.

14. The semiconductor mesh interface of claim 12, wherein the adhesive material comprises a solder material.

15. The semiconductor mesh interface of claim 12, wherein the adhesive material is configured to distribute thermal energy along the plurality of interconnecting struts and throughout a volume of the adhesive material.

16. The semiconductor mesh interface of claim 12, wherein the adhesive material is configured to transmit electrical signals from a first location on the upper surface of the first semiconductor to a second location on the lower surface of the second semiconductor via the plurality of interconnecting struts.

17. A method comprising:

disposing a mesh over a first surface of a first semiconductor, wherein the mesh comprises:

an adhesive material comprising a plurality of interconnecting struts defining a plurality of openings, wherein when the mesh is disposed over the first surface of the first semiconductor, the plurality of openings is configured to receive a first plurality of electrical contacts extending from the first surface of the first semiconductor;

aligning a second plurality of electrical contacts extending from a second surface of a second semiconductor with the first plurality of electrical contacts of the first semiconductor;

electrically connecting the first semiconductor with the second semiconductor via the first plurality of electrical contacts and the second plurality of electrical contacts; and affixing a first surface of the mesh to the first surface of the first semiconductor and a second surface of the mesh to the second surface of the second semiconductor.

18. The method of claim 17, wherein the adhesive material comprises a solder material.

19. The method of claim 17, wherein one or more of the first plurality of electrical contacts and the second plurality of electrical contacts comprises microbumps.

20. The method of claim 17, wherein:

affixing the first surface of the mesh to the first surface of the first semiconductor comprises forming a first hermetic seal between the first surface of the mesh and the first surface of the first semiconductor around a first end of a first opening of the plurality of openings; and affixing the second surface of the mesh to the second surface of the second semiconductor comprises forming a second hermetic seal between the second surface of the mesh and the second surface of the second semiconductor around a second end of the first opening of the plurality of openings.

\* \* \* \* \*